(12) United States Patent
Chou et al.

(10) Patent No.: US 7,116,606 B2
(45) Date of Patent: *Oct. 3, 2006

(54) METHOD AND CIRCUIT OF PLASMA DAMAGE PROTECTION

(75) Inventors: Ming-Hung Chou, Hsinchu (TW); Wen-Pin Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/034,945

(22) Filed: Jan. 14, 2005

(65) Prior Publication Data

US 2006/0157744 A1     Jul. 20, 2006

(51) Int. Cl.
*G11C 11/06* (2006.01)
(52) U.S. Cl. .................. 365/244; 365/115; 365/116
(58) Field of Classification Search ................ 365/244, 365/115, 116, 104, 103
See application file for complete search history.

(56) References Cited

U.S. PATENT DOCUMENTS

| | | | | |
|---|---|---|---|---|
| 5,587,598 A | * | 12/1996 | Hatanaka | .................... 257/355 |
| 5,760,445 A | * | 6/1998 | Diaz | ........................... 257/356 |
| 5,946,574 A | * | 8/1999 | Hsiao | ........................ 438/275 |
| 6,297,984 B1 | * | 10/2001 | Roizin | ........................ 365/106 |
| 6,329,691 B1 | | 12/2001 | Finzi | |
| 6,410,964 B1 | * | 6/2002 | Shida | ......................... 257/356 |
| 6,437,408 B1 | | 8/2002 | Shih et al. | |
| 6,683,351 B1 | * | 1/2004 | Morita et al. | ................ 257/355 |
| 2004/0007730 A1 | | 1/2004 | Chou et al. | |

* cited by examiner

*Primary Examiner*—Van Thu Nguyen
*Assistant Examiner*—Dang Nguyen
(74) *Attorney, Agent, or Firm*—Finnegan, Henderson, Farabow, Garrett & Dunner, L.L.P.

(57) ABSTRACT

A protection circuit to discharge plasma-induced charges in a semiconductor device or integrated circuit includes a PMOS transistor and a diode. The PMOS transistor includes a substrate, a drain, a source, and a gate, the source being coupled to receive the plasma-induced charges. The diode has a positive terminal coupled to the substrate of the PMOS transistor and a negative terminal coupled the gate of the PMOS transistor.

19 Claims, 4 Drawing Sheets

METHOD AND CIRCUIT OF PLASMA DAMAGE PROTECTION

TECHNICAL FIELD

This invention is in general related to a protection circuit for protecting a semiconductor device from plasma damage.

DESCRIPTION OF RELATED ART

During the fabrication of an integrated circuit (IC), metal or polysilicon lines are formed by plasma etching to interconnect devices of the IC. The plasma etching generally induces charges that are accumulated on the metal or polysilicon lines. Because of the relatively high capacitance of an MOS gate, the plasma-induced charges are accumulated in the gate of an MOS device and may tunnel into neighboring dielectrics. Similarly, if the IC includes certain devices with very thin dielectrics, a metal or polysilicon layer on the thin dielectrics is also likely to accumulate a proportion of the plasma-induced charges. Damage caused by the plasma-induced charges includes charge traps created in the dielectrics, deterioration of the interface of the dielectrics, shortening of device lifetime, etc. As a result, the performance of the IC, which may include a plurality of MOS devices or other devices having thin film dielectrics, is degraded.

Methods of protecting the IC from plasma damage during manufacturing processes have been proposed. For example, Chou et al. describes in U.S. Patent Application Publication No. 2004/0007730, a protection device comprising a pair of PMOS and NMOS transistors having their respective gate terminals coupled to their respective substrates. FIGS. 4–5 of U.S. Patent Application Publication No. 2004/0007730 are reproduced as FIGS. 1–2, respectively.

In FIG. 1, an IC device 10 formed on a device substrate 11 includes an IC 12 that is protected by a protective device composed of a PMOS transistor 15 and an NMOS transistor 16. One of the source/drain terminals of PMOS transistor 15 is grounded. The other of the source/drain terminals of PMOS transistor 15 is coupled to a node 14 of IC 12 to provide plasma damage protection. The gate of PMOS transistor 15 is coupled to the substrate of PMOS transistor 15 and is further coupled to receive a voltage generated by a voltage generator 13 during operation. One of the source/drain terminals of NMOS transistor 16 is grounded. The other of the source/drain terminals of NMOS transistor 16 is also coupled to node 14 to provide plasma damage protection. The gate of NMOS transistor 16 is coupled to the substrate of NMOS transistor 16 and is further coupled to receive a voltage from voltage generator 13 during operation.

During manufacturing, voltage generator 13 does not generate voltage outputs and the gates of PMOS transistor 15 and NMOS transistor 16 are floating. During operation of IC device 10, the voltage received by the gate of PMOS transistor 15 is the highest possible operating voltage of IC device 10 and the voltage received by the gate of NMOS transistor 16 is the lowest possible operating voltage of IC device 10, such that both PMOS transistor 15 and NMOS transistor 16 are turned off to avoid interference with the normal operations of IC device 10.

FIG. 2 is a cross-sectional view of PMOS transistor 15 and NMOS transistor 16 formed on a p-type semiconductor substrate 20 (PW). A first deep n-type well 21 (NWD) and a second deep n-type well 22 (NWD) are formed in substrate 20. PMOS transistor 15 has a source 23 and a drain 24 formed in first deep n-type well 21, which is the substrate of PMOS transistor 15, and a gate 27 formed over a channel region defined between source 23 and drain 24. An n-type contact region 25 is formed in the surface of first deep n-type well 21. A p-type contact region 26 is formed in the surface of substrate 20 (PW) adjacent to first deep n-type well 21. A deep p-type well 31 (PWI) is formed in second deep n-well 22. NMOS transistor 16 has a source 32 and a drain 33 formed in p-type well 31, which is the substrate of NMOS transistor 16, and a gate 36 formed over a channel region defined between source 32 and drain 33. An n-type contact region 37 is formed in the surface of second deep n-type well 22. A p-type contact region 34 is formed in the surface of p-type well 31. Also, a p-type contact region 35 is formed in the surface of the substrate 20 adjacent to second deep n-type well 22.

Gate 27 of PMOS transistor 15 is coupled to first deep n-type well 21 via contact region 25 and further coupled to receive a voltage VPCP11 generated by voltage generator 13 during operation, wherein VPCP11 is the highest operating voltage of IC device 10. Source 23 of PMOS transistor 15 is coupled to substrate 20 via contact region 26 and further to a ground reference. Drain 24 of PMOS transistor 15 is coupled to a node 30 (node 14 in FIG. 1) to be protected from plasma damage.

Gate 36 of NMOS transistor 16 is coupled to p-type well 31 via contact region 34 and further coupled to receive a voltage NVPP generated by voltage generator 13 during operation, wherein NVPP is the lowest operating voltage of IC device 10. Source 32 of NMOS transistor 16 is coupled to substrate 20 via contact region 35 and further to a ground reference. Drain 33 of NMOS transistor 16 is also coupled node 30 (node 14 in FIG. 1) to be protected from plasma damage.

During the manufacturing process of IC device 10, gates 27 and 36 are floating. Therefore, if there are positive charges accumulated on node 14 (node 30 in FIG. 2), the positive charges may be discharged through PMOS transistor 15. If there are negative charges accumulated on node 14 (node 30 in FIG. 2), the negative charges may be discharged through NMOS transistor 16.

Particularly, if negative charges are accumulated on node 14, a negative voltage $V_{dN}$ appears at drain 33 of NMOS transistor 16. As a result, the junction between p-type well 31 and drain 33 is forward biased and the bias across the junction is clamped at 0.7 V. In other words, $V_{gN} - V_{dN} = 0.7$ V, wherein $V_{gN}$ is the potential at gate 36 of NMOS transistor 16. NMOS transistor 16 generally has a threshold voltage of less than 0.7 V, for example, 0.65 V. Therefore, NMOS transistor 16 is turned on to conduct current to discharge the negative charges on node 14.

Similarly, when positive charges are accumulated on node 14, PMOS transistor 15 should be turned on to discharge the positive charges. However, the configuration in FIGS. 1 and 2 may not provide a satisfactory protection because PMOS transistors generally have a higher threshold voltage. For example, PMOS transistor 15 may have a threshold voltage of 0.9 V or even higher (negative in sign), in which case PMOS transistor 15 would be off because the forward-biased junction between drain 24 and first n-type well 21 is clamped at 0.7 V, which is less than 0.9 V.

SUMMARY OF THE INVENTION

Consistent with embodiments of the present invention, there is provided a protection circuit to discharge plasma-induced charges in a semiconductor device or integrated circuit includes a PMOS transistor and a diode. The PMOS transistor includes a substrate, a drain, a source, and a gate, the source being coupled to receive the plasma-induced charges. The diode has a positive terminal coupled to the substrate of the PMOS transistor and a negative terminal coupled the gate of the PMOS transistor.

Consistent with embodiments of the present invention, there is also provided a semiconductor device or integrated circuit (IC) formed on a semiconductor substrate that includes a first part to be protected from plasma-induced charge damage and a second part for protecting the first part from plasma-induced charge damage. The second part includes a PMOS transistor in an n-type well in the semiconductor substrate, including a drain, a source, and a gate, the source being coupled to receive plasma-induced charges accumulated in the first part; and a diode having a positive terminal coupled to the n-type well and a negative terminal coupled the gate of the PMOS transistor.

Consistent with embodiments of the present invention, there is further provided a memory device that includes a memory array including a plurality of word lines and a protection circuit for protecting the word lines from plasma-induced charge damage. The protection circuit includes a PMOS transistor including a substrate, a drain, a source, and a gate, the source being coupled to receive plasma-induced charges accumulated in the word lines, and a diode having a positive terminal coupled to the substrate of the PMOS transistor and a negative terminal coupled the gate of the PMOS transistor.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to the embodiments of the invention, examples of which are illustrated in the accompanying drawings. Wherever possible, the same reference numbers will be used throughout the drawings to refer to the same or like parts.

Consistent with embodiments of the present invention, there is provided a protection circuit that discharges both positive and negative plasma-induced charges.

Figure 1:
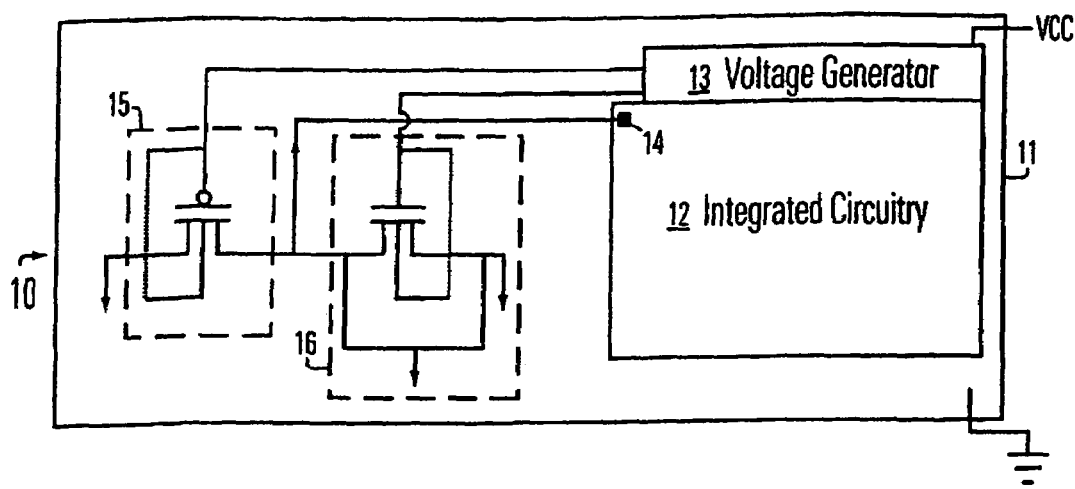
FIG. 1 shows a conventional circuit having a protective device.
Figure 2:
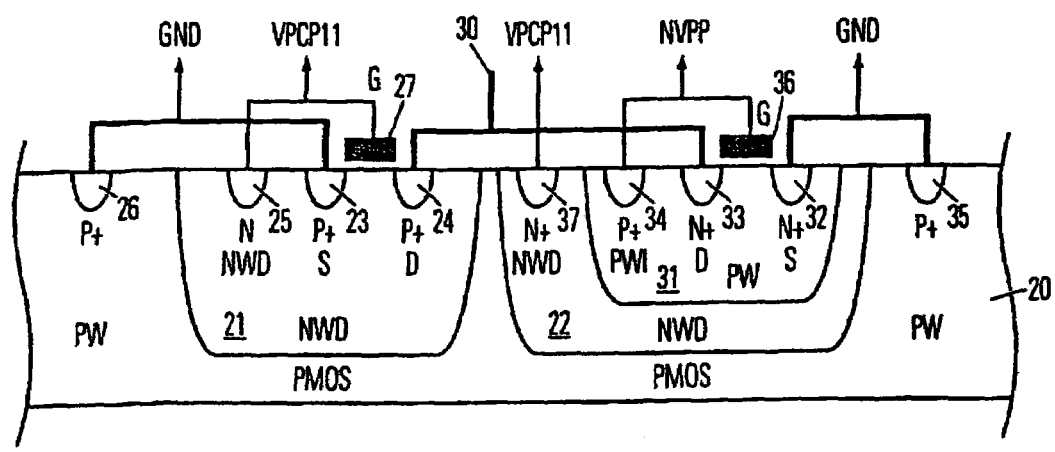
FIG. 2 is a cross-sectional view of the protective device of FIG. 1.
Figure 3:
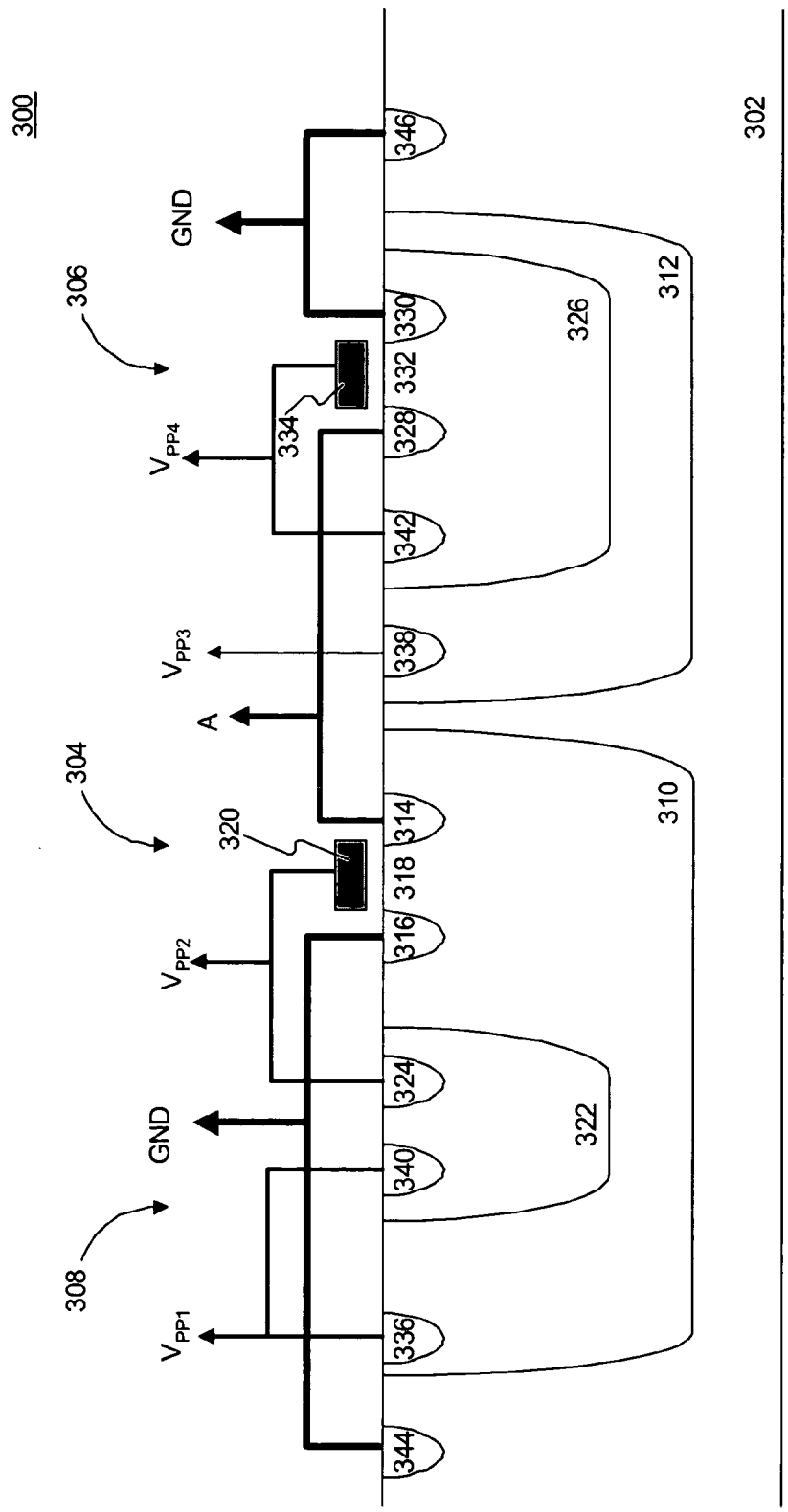
FIG. 3 is a cross-sectional view of a protection circuit consistent with a first embodiment of the present invention.
Figure 4:
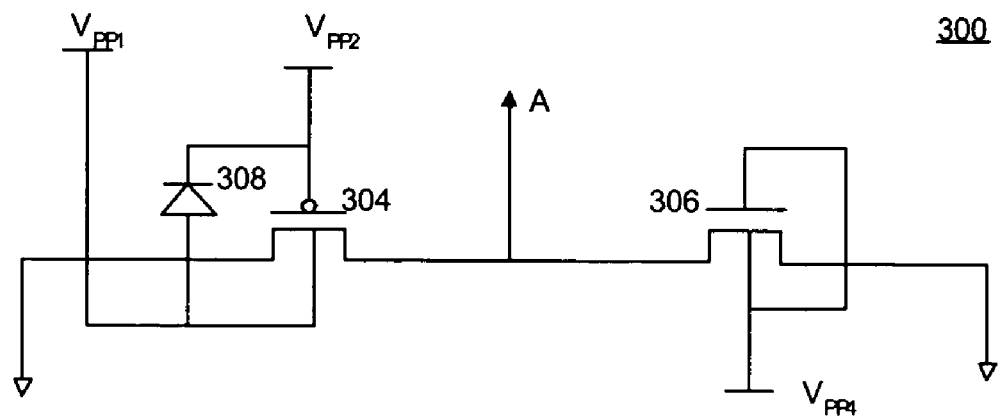
FIG. 4 is an equivalent circuit of the protection circuit of FIG. 3.

FIG. 3 is a cross-sectional view of a protection circuit 300 consistent with a first embodiment of the present invention. FIG. 4 is an equivalent circuit of protection circuit 300.

Protection circuit 300 is formed on a p-type semiconductor substrate 302 and includes a PMOS transistor 304, an NMOS transistor 306, and a diode 308. A first deep n-type well (n-well) 310 and a second deep n-well 312 are formed in substrate 302.

Both PMOS transistor 304 and diode 308 are formed in first n-well 310. PMOS transistor 304 includes a source 314, a drain 316, a channel region 318 defined therebetween, and a gate 320 over channel region 318. Diode 308 is formed in a first p-type well (p-well) 322 provided in first n-well 310 and is composed of first p-well 322 and an $n^+$ diffusion region 324 formed in p-well 322.

NMOS transistor 306 is formed in a second p-well 326 provided in second n-well 312. NMOS transistor 306 includes a source 328, a drain 330, a channel region 332 defined therebetween, and a gate 334 over channel region 332.

Well pick-ups 336, 338, 340, and 342 are respectively provided in first n-well 310, second n-well 312, first p-well 322, and second p-well 326. Well pick-ups 344 and 346 are provided in substrate 302, wherein well pick-up 344 is formed adjacent to first n-well 310, and well pick-up 346 is formed adjacent to second n-well 312.

Drain 316 of PMOS transistor 304, drain 330 of NMOS transistor 306, and well pick-ups 344 and 346 are grounded. The positive terminal of diode 308, i.e., first p-well 322, is coupled to first n-well 310 through well pick-ups 336 and 340 and is further connectable to a first voltage $V_{PP1}$. The negative terminal of diode 308, i.e., $n^+$ diffusion region 324, is coupled to gate 320 of PMOS transistor and is further connectable to a second voltage $V_{PP2}$. Second n-well 312 is connectable through well pick-up 338 to a third voltage $V_{PP3}$. Second p-well 326, i.e., the substrate of NMOS transistor 306, is coupled to gate 334 of NMOS transistor 306 and is further connectable to a fourth voltage $V_{PP4}$. Both source 314 of PMOS transistor 304 and source 328 of NMOS transistor 306 are connectable to a node A of an external circuit (not shown) for protecting node A from plasma damage. Node A may be any part of a semiconductor device or circuit that needs to be protected from plasma damage. For example, node A may be the gate of an MOS structure.

During the manufacturing process of protection circuit 300 and the semiconductor device or IC, which circuit 300 is provided to protet from plasma-induced charge, $V_{PP1}$, $V_{PP2}$, $V_{PP3}$, and $V_{PP4}$ are floating. Therefore, if there are positive charges accumulated on node A, the positive charges may be discharged through PMOS transistor 304. If there are negative charges accumulated on node A, the negative charges may be discharged through NMOS transistor 306.

Particularly, if negative charges are accumulated on node A, a negative voltage $V_{sN}$ appears at source 328 of NMOS transistor 306. As a result, the junction between second p-well 326 and source 328 is forward biased and the bias across the junction is clamped at 0.7 V. In other words, $V_{gs}=V_{gN}-V_{sN}=0.7$ V, wherein $V_{gN}$ is the potential at gate 334 of NMOS transistor 306. NMOS transistor 306 generally has a threshold voltage of less than 0.7 V, for example, 0.65 V. Therefore, NMOS transistor 306 is turned on to conduct current to discharge the negative charges on node A.

On the other hand, if positive charges are accumulated on node A, a positive voltage $V_{sP}$ appears at source 314 of PMOS transistor 304, and both the junction between source 314 and first n-well 310 and diode 308 are forward biased. As a result, the potential $V_{gP}$ at gate 320 of PMOS transistor 304 is lower than the positive voltage $V_{sP}$ at source 314 of PMOS transistor 304 by a fixed amount of 1.4 V, which is twice the potential drop across a forward-biased p-n junction (note that the substrate of PMOS transistor 304, i.e., first n-well 310, and the positive terminal 322 of diode 308 are at the same potential through the coupling of well pick-ups 336 and 340). In other words, even if PMOS transistor 304 has a threshold voltage higher than 0.7 V (negative in sign), the large potential drop of 1.4 V across source 314 and gate 320 thereof is sufficient to turn on PMOS transistor 304 to conduct current to discharge the positive charges accumulated on node A.

When protection circuit 300 is used to protect semiconductor device or an integrated circuit (IC), both PMOS transistor 304 and NMOS transistor 306 are turned off to avoid interference with the normal operations of the semiconductor device or IC. In one aspect, $V_{PP4}$ is the lowest possible operating voltage of such semiconductor device or IC. In another aspect, $V_{PP1}$, $V_{PP2}$ and $V_{PP3}$ all equal the highest possible operating voltage of the semiconductor device or IC. However, to avoid shorting the positive terminal and negative terminal of diode 308, the substrate of PMOS transistor 304, i.e., first n-well 310, and gate 320 of PMOS transistor 304 must be separately coupled to receive the highest possible operating voltage.

Figure 5:
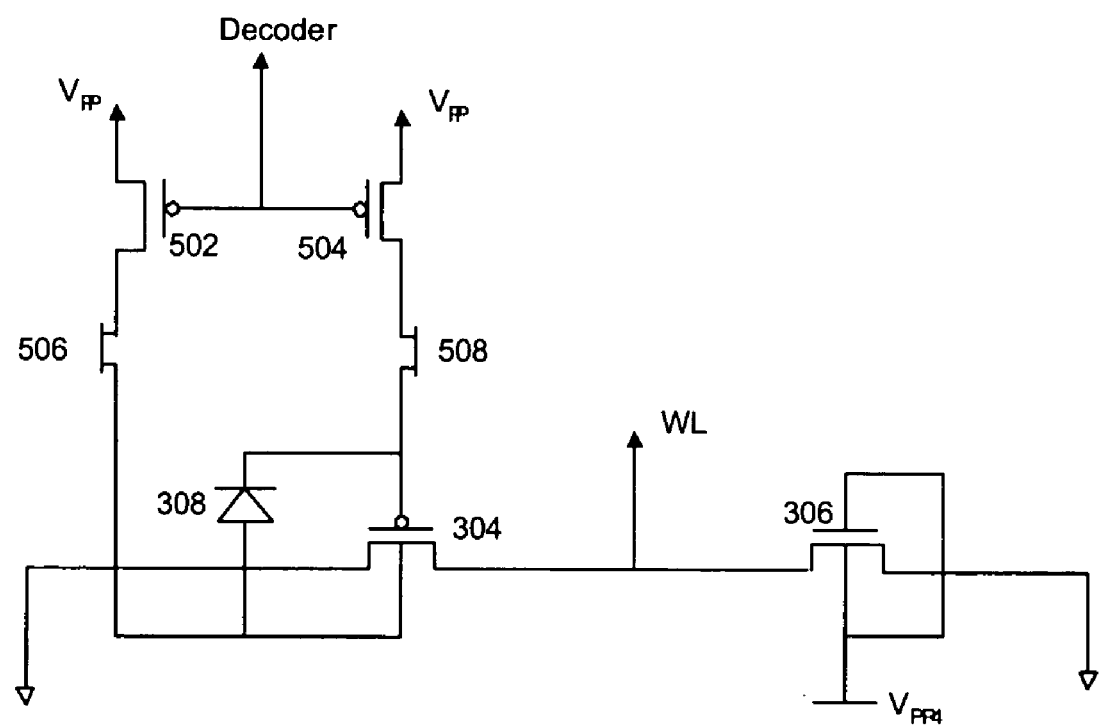
FIG. 5 shows a protection circuit consistent with a second embodiment of the present invention.

For example, consistent with a second embodiment of the present invention, protection circuit 300 may be used to protect a word line of a memory device generally comprising a polysilicon stripe formed on a thin gate dielectric layer which may be subject to plasma damages. FIG. 5 shows that a word line (WL) of a memory device (not shown) may be protected by protection circuit 300 by coupling the word line (WL) to the sources of PMOS transistor 304 and NMOS transistor 306. FIG. 5 also shows that the substrate of PMOS transistor 304, i.e., first n-well 310, and gate 320 of PMOS transistor 304 are coupled respectively through two PMOS transistors 502 and 504 to a voltage $V_{PP}$, where $V_{PP}$ is the highest possible operating voltage of the memory device. In one aspect, the substrate and gate 320 of PMOS transistor 304 are coupled respectively to the drains (not numbered) of PMOS transistors 502 and 504 through jumper connectors 506 and 508 formed of a top level metal so as to reduce the plasma damage to the gate dielectric of PMOS transistors 502, 504, and 304.

TABLE 1

|  | Program | Erase | Read |
| --- | --- | --- | --- |
| WL | 11.5 V | −3 V | 2.6 V |
| NMOS Gate | GND | $NV_{PP}$ | GND |
| NMOS Substrate | $V_{PP}$ | $V_{CC}$ | $V_{CC}$ |
| NMOS Drain | GND | GND | GND |
| PMOS Gate | $V_{PP}$ | $V_{CC}$ | $V_{CC}$ |
| PMOS Drain | GND | GND | GND |

Table 1 shows exemplary biasing conditions of the word lines of the memory device and protection circuit 300. $V_{PP}$ is the highest possible operating voltage of the memory device, which is no less than the 11.5 V voltage on the word line during the programming operation. $V_{CC}$ is the positive power supply of the memory device during erasing and reading operations. $NV_{PP}$ is the lowest possible operating voltage of the memory device, which is no greater than the −3 V voltage on the word line during the erasing operation. During the reading operation, if $V_{CC}$ is less than the 2.6 V voltage on the word line, gate 320 of PMOS transistor 304 should be biased at 2.6 V instead of $V_{CC}$. A decoder (not shown) may be included in the memory device and coupled to control PMOS transistor 502 and NMOS transistor 504 to guarantee the biasing conditions shown in Table 1, so that PMOS transistor 304 and NMOS transistor 306 are turned off during the operations of the memory device and protection circuit 300.

Figure 6:
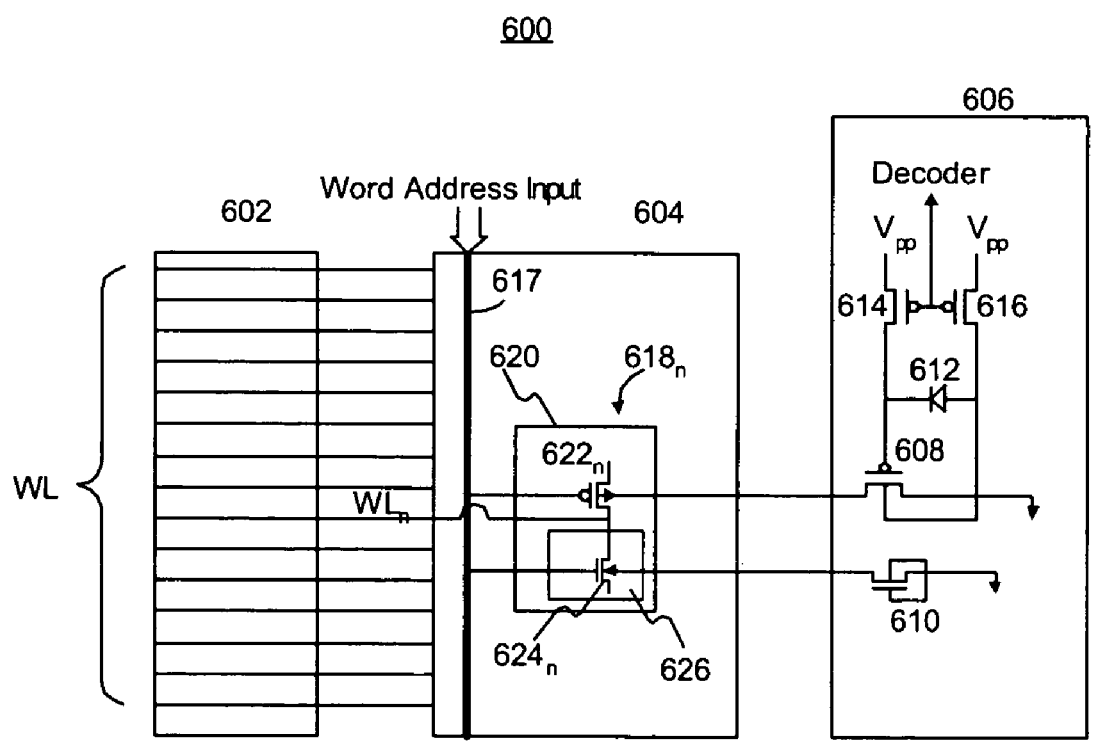
FIG. 6 shows a memory device having a protection circuit consistent with a third embodiment of the present invention.

Consistent with a third embodiment of the present invention, a protection circuit similar to protection circuit 300 of FIG. 3 may be used to protect multiple word lines of a memory device. FIG. 6 shows a memory device 600 including a memory array 602 having a plurality of word lines WL, a word line decoder 604 for decoding a word address for driving one of the word lines WL, and a protection circuit 606 for protecting multiple word lines WL from plasma damage.

As shown in FIG. 6, protection circuit 606 includes a PMOS transistor 608, an NMOS transistor 610, and a diode 612. Each of PMOS transistor 608 and NMOS transistor 610 has a gate (not numbered), a source (not numbered), a drain (not numbered), and a substrate (not numbered). Diode 612 has a positive terminal (not numbered) and a negative terminal (not numbered). The gate of PMOS transistor 608 is coupled to the negative terminal of diode 612 and further coupled to receive a voltage $V_{PP}$ through a PMOS transistor 614, where $V_{PP}$ is the highest possible operating voltage of memory device 600. The substrate of PMOS transistor 608 is coupled to the positive terminal of diode 612 and further coupled to receive voltage $V_{PP}$ through a PMOS transistor 616. The drain of PMOS transistor 608 is grounded. The gate and the substrate of NMOS transistor 610 are tied together. The drain of NMOS transistor 610 is grounded. Protection circuit 606 has the same configuration as protection circuit 300, except that the sources of PMOS transistor 608 and NMOS transistor 610 are not connected together.

In operation, word line (WL) decoder 604 decodes a word address received at an address bus line 617 and drives a word line through a corresponding word line driver. FIG. 6 shows an exemplary word line driver $618_n$ that drives a word line $WL_n$, where n is the integer index of that word line. Word line driver $618_n$ is formed in an n-well 620 and includes a PMOS transistor $622_n$ in n-well 620 and an NMOS transistor $624_n$ in a p-well 626 formed in n-well 620. Each of PMOS transistor $622_n$ and NMOS transistor $624_n$ has a gate (not numbered), a drain (not numbered), a source (not numbered), and a substrate (not numbered). The gates of PMOS transistor $622_n$ and NMOS transistor $624_n$ are coupled to address bus line 617 to receive the address. The sources of PMOS transistor $622_n$ and NMOS transistor $624_n$ are coupled to power supplies or other devices of WL decoder 604. The drains of PMOS transistor $622_n$ and NMOS transistor $624_n$ are both coupled to word line $WL_n$.

Consistent with the third embodiment of the present invention, the substrate of PMOS transistors 622 of all word line drivers 618 are coupled to the source of PMOS transistor 608, and the substrate of NMOS transistors 624 of all word line drivers 618 are coupled to the source of NMOS transistor 610.

Thus, if plasma-induced charges are accumulated on a word line $WL_n$, the charges may be discharged either through PMOS transistor $622_n$ and PMOS transistor 608, if the charges are positive, or through NMOS transistor 624$_n$ and NMOS transistor 610, if the charges are negative. These discharge mechanisms should now be understood by one skilled in the art and therefore are not described in detail herein.

As discussed above, by adding a diode (308 or 612) between the substrate and the gate of the PMOS transistor (304 or 608), the protection circuits consistent with embodiments of the present invention provide safe protection from plasma damage even when the threshold voltage of the PMOS transistor is higher than 0.7 V, and therefore provides improvement over the problem of the protection circuit of the conventional art.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A protection circuit to discharge plasma-induced charges in a semiconductor device or integrated circuit, comprising:
    a PMOS transistor including a substrate, a drain, a source, and a gate, the source being coupled to receive the plasma-induced charges; and
    a diode having a positive terminal coupled to the substrate of the PMOS transistor and a negative terminal coupled to the gate of the PMOS transistor.

2. The circuit of claim 1, wherein the drain of the PMOS transistor is grounded and the PMOS transistor is turned on to discharge the plasma-induced charges when the plasma-induced charges are positive.

3. The circuit of claim 1, wherein the gate and the substrate of the PMOS transistor are for separately coupling to receive a highest possible operating voltage of the semiconductor device or integrated circuit during operation.

4. The circuit of claim 3, wherein the PMOS transistor is a first PMOS transistor, the circuit further comprising a second PMOS transistor and a third PMOS transistor each having a gate, a source, and a drain, wherein the drain of the second PMOS transistor is coupled to the gate of the first PMOS transistor and the drain of the third PMOS transistor is coupled to the substrate of the first PMOS transistor, wherein the sources of the second and third PMOS transistors are both for coupling to receive the highest possible operating voltage, the circuit further comprising a decoder coupled to the gates of the second and third PMOS transistors for controlling a status of the second and third PMOS transistors.

5. The circuit of claim 4, wherein the drain of the second PMOS transistor is coupled to the gate of the first PMOS transistor through a first jumper connector and the drain of the third PMOS transistor is coupled to the substrate of the first PMOS transistor through a second jumper connector, the first and second jumper connectors being formed of a top level metal.

6. The circuit of claim 1, further comprising an NMOS transistor including a substrate, a source coupled to receive the plasma-induced charges, a drain for coupling to ground, and a gate coupled to the substrate and further for coupling to receive a lowest possible operating voltage of the semiconductor device or integrated circuit, wherein the NMOS transistor is turned on to discharge the plasma-induced charges when the plasma-induced charges are negative.

7. A semiconductor device or integrated circuit (IC) formed on a semiconductor substrate, comprising:
    a first part to be protected from plasma-induced charge damage; and
    a second part for protecting the first part from plasma-induced charge damage, including
        a PMOS transistor in an n-type well in the semiconductor substrate, including a drain, a source, and a gate, the source being coupled to receive plasma-induced charges accumulated in the first part; and
        a diode having a positive terminal coupled to the n-type well and a negative terminal coupled to the gate of the PMOS transistor.

8. The device or IC of claim 7, wherein the drain of the PMOS transistor is for coupling to ground and the PMOS transistor is turned on to discharge the plasma-induced charges when the plasma-induced charges are positive.

9. The device or IC of claim 7, wherein the gate and the substrate of the PMOS transistor are for separately coupling to receive a highest possible operating voltage of the device or IC during operation.

10. The device or IC of claim 9, wherein the PMOS transistor is a first PMOS transistor, the second part further comprising a second PMOS transistor and a third PMOS transistor each having a gate, a source, and a drain, wherein the drain of the second PMOS transistor is coupled to the gate of the first PMOS transistor and the drain of the third PMOS transistor is coupled to the n-type well, wherein the sources of the second and third PMOS transistors are both for coupling to receive the highest possible operating voltage during the operation of the device or IC, the second part further comprising a decoder coupled to the gates of the second and third PMOS transistors for controlling a status of the second and third PMOS transistors.

11. The device or IC of claim 7, the second part further comprising an NMOS transistor in a p-type well in the semiconductor substrate, the NMOS transistor including a source coupled to receive the plasma-induced charges, a drain coupled to the semiconductor substrate and for coupling to ground, and a gate coupled to the p-type well and for coupling to receive a lowest possible operating voltage of the semiconductor device or IC, wherein the NMOS transistor is turned on to discharge the plasma-induced charges when the plasma-induced charges are negative.

12. The device or IC of claim 7, wherein the first part comprises a memory array including a plurality of word lines, and wherein the second part protects one of the word lines from plasma damage.

13. A memory device, comprising:
    a memory array including a plurality of word lines; and
    a protection circuit for protecting the word lines from plasma-induced charge damage, including
        a PMOS transistor including a substrate, a drain, a source, and a gate, the source being coupled to receive plasma-induced charges accumulated in the word lines, and
        a diode having a positive terminal coupled to the substrate of the PMOS transistor and a negative terminal coupled to the gate of the PMOS transistor.

14. The device of claim 13, wherein the drain of the PMOS transistor is for coupling to ground and the PMOS transistor is turned on to discharge the plasma-induced charges when the plasma-induced charges are positive.

15. The device of claim 13, wherein the gate and the substrate of the PMOS transistor are for separately coupling to receive a highest possible operating voltage of the device during operation.

16. The device of claim 15, wherein the PMOS transistor is a first PMOS transistor, the protection circuit further comprising a second PMOS transistor and a third PMOS transistor each having a gate, a source, and a drain, wherein the drain of the second PMOS transistor is coupled to the gate of the first PMOS transistor and the drain of the third PMOS transistor is coupled to the substrate of the first PMOS transistor, wherein the sources of the second and third PMOS transistors are both coupled to receive the highest possible operating voltage during operation, the protection circuit further comprising a decoder coupled to the gates of the second and third PMOS transistors for controlling a status of the second and third PMOS transistors.

17. The device of claim 13, wherein the PMOS transistor is a first PMOS transistor, the device further comprising a word line decoder for decoding a word line address, the word line decoder including a plurality of word line drivers each coupled to drive a corresponding one of the word lines, each word line driver including a second PMOS transistor having a substrate, a drain, and a gate, the gate of the second PMOS transistor being coupled to receive the word line address, the drain of the second PMOS transistor being coupled to drive the corresponding one of the word lines, and the substrate of the second PMOS transistor being coupled to the source of the first PMOS transistor.

18. The circuit of claim 13, further comprising an NMOS transistor including a substrate, a source coupled to receive the plasma-induced charges, a drain for coupling to ground, and a gate coupled to the substrate and further for coupling to receive a lowest possible operating voltage of the device, wherein the NMOS transistor is turned on to discharge the plasma-induced charges when the plasma-induced charges are negative.

19. The device of claim 18, wherein the NMOS transistor is a first NMOS transistor, the device further comprising a word line decoder for decoding a word line address, the word line decoder including a plurality of word line drivers each coupled to drive a corresponding one of the word lines, each word line driver including a second NMOS transistor having a substrate, a drain, and a gate, the gate of the second NMOS transistor being coupled to receive the word line address, the drain of the second NMOS transistor being coupled to drive the corresponding one of the word lines, and the substrate of the second NMOS transistor being coupled to the source of the first NMOS transistor.

* * * * *